United States Patent
Aoki et al.

[11] 4,001,612
[45] Jan. 4, 1977

[54] LINEAR RESISTANCE ELEMENT FOR LSI CIRCUITRY

[75] Inventors: Takaaki Aoki, Kanagawa, Japan; Paul Evrenidis, Raleigh, N.C.; Ryo Igarashi, Shiga, Japan; Seiki Ogura, Raleigh, N.C.

[73] Assignee: International Business Machines Corporation, Armonk, N.Y.

[22] Filed: Dec. 17, 1975

[21] Appl. No.: 641,469

[52] U.S. Cl. .................................. 307/304; 357/51
[51] Int. Cl.² ................... H01L 27/02; H01L 29/66
[58] Field of Search ............. 307/304; 357/41, 51; 330/35

[56] References Cited
UNITED STATES PATENTS

| | | | |
|---|---|---|---|
| 3,700,981 | 10/1972 | Masuhara et al. | 307/304 X |
| 3,829,888 | 8/1974 | Hashimoto et al. | 357/41 |

OTHER PUBLICATIONS

Lehman et al., "Fabrication of Field Effect Transistors;" IBM Tech. Discl. Bull.; vol. 8, No. 4, pp. 677–678; 9/1965.

*Primary Examiner*—John S. Heyman
*Assistant Examiner*—Larry N. Anagnos
*Attorney, Agent, or Firm*—Delbert C. Thomas

[57] ABSTRACT

This invention features the use of two paralleled insulated gate depletion channel field effect transistors (FET) having their gates connected one to the source voltage and one to the drain voltage to provide a linear resistance element. The actual resistance value can be controlled by selecting design parameters and can be extended by using a plurality of such elements in series to provide greater resistances and/or higher voltage capabilities or in parallel to provide greater current capacity. The described resistor is used as a cost and space saving alternate to discrete resistor components and is particularly useful as a part of an integrated circuit in analog type devices.

2 Claims, 2 Drawing Figures

LINEAR RESISTANCE ELEMENT FOR LSI CIRCUITRY

This invention relates to a resistance element to be used as a part of the deposited circuit of integrated circuit chips, particularly large scale integrated chips, whenever a linear resistance type circuit is needed for analog type devices.

In previous integrated circuits for analog uses, it has heretofor been the custom to use discrete resistors connected to the circuit chip or to provide a resistive deposit on the surface of the chip. In view of the size of conventional integrated circuit chips, particularly those using insulated gate field effect transistors (IGFETs), the use of discrete resistors is expensive in terms of cost and in the use of valuable connection points on the chip. The use of a deposited resistor on the chip surface is also wasteful in terms of cost necessitated by extra processing operations and in view of the surface area appropriated to the resistance element. The deposited resistors are also deficient in their resistance range since high resistance values would require such narrow deposited lines of resistance material as to be impractical.

It has also been known that individual deposited FETs are useful as current control units, but these have not been linear and are of negligible value in analog type circuits where a constant resistance value is needed over an operating range of voltages.

It is then an object of this invention to develop a circuit of deposited units suitable as a constant value resistor in integrated circuits.

It is also an object to provide a circuit configuration for integrated circuits which will maintain a linear current-voltage relationship over an operating range of voltage.

A further object is to provide such a circuit configuration which requires only a minimal space on a circuit chip and which may be developed by the same processes as other active elements of the chip are formed.

A still further object is to enable such a resistive circuit configuration to be developed at the same time as and by the same means as the other active components are provided in and connected on said chip.

These and other objects will be apparent in the following description of a preferred embodiment of the invention together with the appended drawings.

Figure 1:
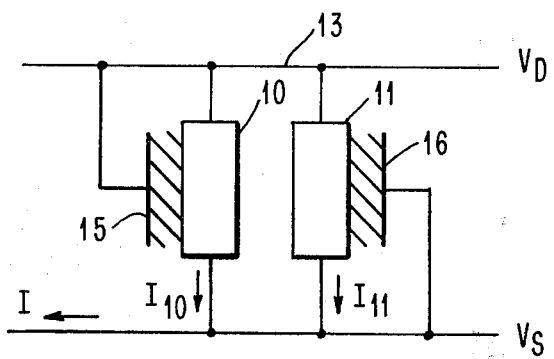
FIG. 1 is a diagram of a circuit according to the invention.

The basic circuit of the invention as shown in FIG. 1 is composed of two similar field effect transistors 10 and 11 having their source electrodes connected together and to a voltage source (VS) 12 and having their drain electrodes similarly connected together and to the other side of the voltage source (VD) 13. The gates 15, 16 of the two FETs are connected one (15) to the common drain electrode 13 and the other (16) to the common source electrode 12. The FETs are of the depletion type as is indicated by the lining between the body and the gate of the FET. It is a characteristic of this type of FET that when voltage is applied between the source and the drain, current will flow through the FET. It is necessary to apply a negative gate voltage ($-V_t$) with respect to the source to cut off this current.

A high linearity of the voltage-current relationship for this FET pair can be obtained by choosing proper parameters for the devices. The drain current for FET 10 can be approximated by $$I10 = W10 \cdot C \cdot \mu / L10 \; \{ (V_D - V_S - V_T)(V_D - V_S) - \tfrac{1}{2}(V_D - V_S)^2 \}$$

and for FET 11, the current is approximately $$I11 = W11 \cdot C \cdot \mu / L11 \; \{ (-V_T)(V_D - V_S) - \tfrac{1}{2}(V_D - V_S)^2 \}$$

where $$-V_T \geq (V_D - V_S)$$

W10 and W11 are the channel widths of the FETs 10 and 11, L10 and L11 are the corresponding channel lengths, C is the capacitance of the oxide layers per unit area of the gates, $\mu$ is the electron mobility in the material, $V_S$ is the source voltage, $V_D$ is the drain voltage and $V_T$ is the turn-on voltage. For the usual case where W10=W11=W and L10=L11=L, the total current I will be given by $$I = I11 + I12 = -2 \cdot W \cdot C \cdot \mu \cdot V_T / L \; (V_D - V_S)$$

where $$-V_T \geq V_D - V_S.$$

The equivalent resistance value R is $$R = V_D - V_S / I = -L / 2 \cdot W \cdot C \cdot \mu \cdot V_T \quad -V_T \geq (V_D - V_S)$$

It will be seen from this that the resistance of the FET pair will depend upon the parameters fixed by the device design and will be independent of the circuit current or voltage. This constant resistance is, however, only available so long as the source to drain voltage does not exceed the threshold voltage $V_T$.

Figure 2:
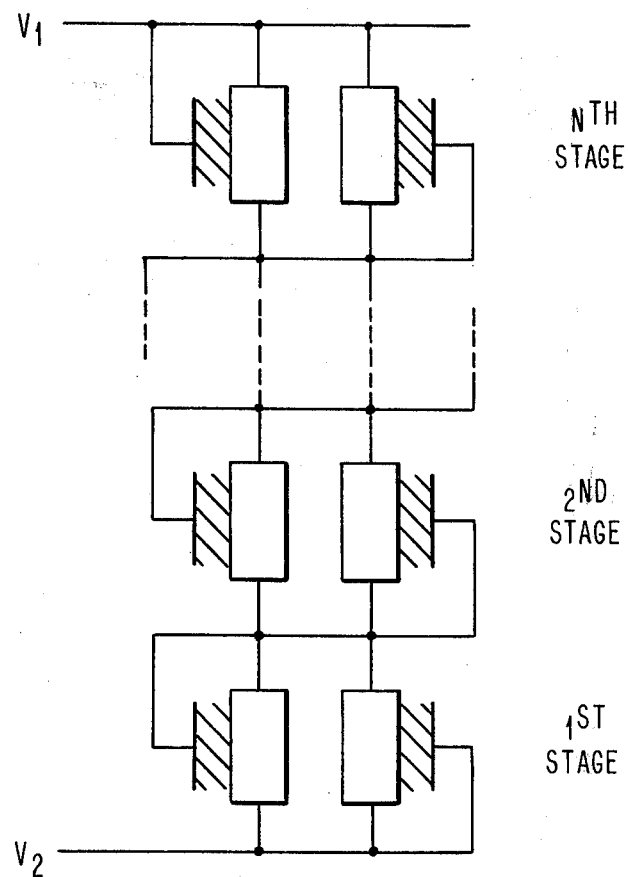
FIG. 2 is a diagram of a plurality of the circuits of FIG. 1 connected to provide a larger resistance or higher voltage capability.

This limitation on voltage may be overcome by the technique shown in FIG. 2. In this configuration, a voltage source between lines $V_1$ and $V_2$, which source may be greater than $-V_T$, is connected by a plurality of circuits as in FIG. 1 in a series arrangement. With similar design parameters for all of the FETs, each stage resistance will be the same and the $V_1$ to $V_2$ voltage will divide equally across the series string so that no FET pair will be subjected to a voltage greater than $V_T$.

The structure of FIG. 2 may also be used to divide an applied voltage into a number of equal parts for use as a voltage divider. If the desired fractional output voltage is other than a voltage resulting from a division by a small integer, a different separation of input voltage may be obtained by varying the design parameters W and L so that the resistances of the stages are not equal, and thus have different voltages across the stages. Care must be taken in this arrangement to insure that the maximum voltage across the highest resistance stage does not exceed the $-V_T$ for that stage.

The above description of a preferred embodiment of our invention is illustrative only and is not to be taken as limiting the scope of the following claims to the configuration shown.

What is claimed is:

1. A constant resistance integrated circuit configuration for a semi-conductor chip, said circuit comprising:

two substantially similar depletion mode field effect transistors, each having a source and a drain electrode connected by a conductive region;

a conductive area on said chip connected to said drain electrodes of both said transistors to form a drain connection;

a second conductive area on said chip connected to said source electrodes of both said transistors to form a source connection;

a pair of gate electrodes, each forming a part of one of said transistors with each gate electrode adjacent to and insulated from an associated one of said conductive regions to control the flow of current therein;

a conductor connecting one of said gate electrodes to said drain connection; and another conductor connecting the other of said gate electrodes to said source connection.

2. A constant resistance integrated circuit for use with other circuits on a semi-conductor substrate, said circuit comprising:

a pair of depletion mode field effect transistors, each having a source terminal and a drain terminal connected by a conductive region and each with a gate electrode adjacent to and insulated from said conductive region, a conductor connected to the drain terminals of both said transistors and to one of said gates, and a second conductor connected to the source terminals of both said transistors and to the other of said gates, said first and second conductors being connectable with other circuits on said chip to control current flow therein.

* * * * *